(12) United States Patent
Anderson et al.

(10) Patent No.: US 12,439,766 B2
(45) Date of Patent: Oct. 7, 2025

(54) ENCAPSULATION SYSTEM FOR AN OPTOELECTRONIC COMPONENT COMPRISING AT LEAST A FIRST ENCAPSULATION AND A SECOND ENCAPSULATION, AND OPTOELECTRONIC COMPONENT COMPRISING AN ENCAPSULATION SYSTEM OF THIS KIND

(71) Applicant: HELIATEK GMBH, Dresden (DE)

(72) Inventors: Merve Anderson, Dresden (DE); Michael Eritt, Dresden (DE); Judith Geoerg, Dresden (DE); Michael Meissner, Dresden (DE); Ralph Wichtendahl, Dresden (DE)

(73) Assignee: HELIATEK GMBH, Dresden (DE)

( * ) Notice: Subject to any disclaimer, the term of this patent is extended or adjusted under 35 U.S.C. 154(b) by 0 days.

(21) Appl. No.: 17/790,763

(22) PCT Filed: Jan. 5, 2021

(86) PCT No.: PCT/DE2021/100001
§ 371 (c)(1),
(2) Date: Jul. 5, 2022

(87) PCT Pub. No.: WO2021/139853
PCT Pub. Date: Jul. 15, 2021

(65) Prior Publication Data
US 2023/0036237 A1     Feb. 2, 2023

(30) Foreign Application Priority Data
Jan. 6, 2020 (DE) .................... 10 2020 200 053.0

(51) Int. Cl.
*H10K 30/88*     (2023.01)
*H10F 19/80*     (2025.01)

(52) U.S. Cl.
CPC ............. *H10K 30/88* (2023.02); *H10F 19/80* (2025.01)

(58) Field of Classification Search
CPC ............................................ H01L 31/048–049
See application file for complete search history.

(56) References Cited

U.S. PATENT DOCUMENTS

| 6,765,351 B2 | 7/2004 | Forrest et al. |
| 10,644,262 B2 | 5/2020 | Wittmann et al. |
| (Continued) | | |

FOREIGN PATENT DOCUMENTS

| DE | 102004014046 A1 | 9/2004 |
| DE | 102016106846 A1 | 10/2017 |
| (Continued) | | |

OTHER PUBLICATIONS

Machine translation of JP2012080060A (Year: 2012).*

*Primary Examiner* — Ryan S Cannon
(74) *Attorney, Agent, or Firm* — LEYDIG, VOIT & MAYER, LTD.

(57) ABSTRACT

An encapsulation system, including a first encapsulation formed from at least one front barrier layer on a front face of the optoelectronic component and at least one rear barrier layer on a reverse face of the optoelectronic component with at least one first connecting material disposed in between, and a second encapsulation formed from at least one front protective layer on the front face of the optoelectronic component and at least one rear protective layer on the reverse face of the optoelectronic component with at least one second connecting material disposed in between, wherein the first encapsulation surrounds the optoelectronic component such that the first encapsulation projects beyond the optoelectronic component by a first edge region, and the second encapsulation surrounds the first encapsulation comprising the optoelectronic component such that the second (Continued)

encapsulation projects beyond the first edge region of the first encapsulation by a second edge region.

20 Claims, 4 Drawing Sheets

(56) References Cited

U.S. PATENT DOCUMENTS

| | | | |
|---|---|---|---|
| 2007/0090371 A1 | 4/2007 | Drechsel et al. | |
| 2007/0216300 A1 | 9/2007 | Lee et al. | |
| 2007/0295385 A1 | 12/2007 | Sheats et al. | |
| 2008/0289682 A1* | 11/2008 | Adriani | B32B 17/10889 257/E31.13 |
| 2009/0114262 A1* | 5/2009 | Adriani | B23K 20/10 136/244 |
| 2010/0025723 A1* | 2/2010 | Young | H05B 33/04 257/E33.056 |
| 2011/0041890 A1* | 2/2011 | Sheats | H01L 31/022433 136/244 |
| 2011/0120550 A1* | 5/2011 | Okada | H01G 9/2095 136/256 |
| 2013/0092972 A1* | 4/2013 | Kim | H10K 50/8445 438/26 |
| 2015/0029681 A1* | 1/2015 | Mack | C23C 14/32 361/748 |
| 2016/0343988 A1* | 11/2016 | Meyer | H10K 77/111 |
| 2017/0110680 A1 | 4/2017 | Nasu et al. | |
| 2021/0159449 A1* | 5/2021 | Joimel | H10K 50/844 |

FOREIGN PATENT DOCUMENTS

| | | | |
|---|---|---|---|
| EP | 2927985 A1 | 10/2015 | |
| JP | 2012080060 A | * 4/2012 | |
| WO | WO-2008150558 A1 | * 12/2008 | ....... B32B 17/10036 |

\* cited by examiner

ENCAPSULATION SYSTEM FOR AN OPTOELECTRONIC COMPONENT COMPRISING AT LEAST A FIRST ENCAPSULATION AND A SECOND ENCAPSULATION, AND OPTOELECTRONIC COMPONENT COMPRISING AN ENCAPSULATION SYSTEM OF THIS KIND

CROSS-REFERENCE TO PRIOR APPLICATIONS

This application is a U.S. National Phase application under 35 U.S.C. § 371 of International Application No. PCT/DE2021/100001, filed on Jan. 5, 2021, and claims benefit to German Patent Application No. DE 10 2020 200 053.0, filed on Jan. 6, 2020. The International Application was published in German on Jul. 15, 2021 as WO 2021/139853 A1 under PCT Article 21(2).

FIELD

The invention relates to an encapsulation system for an optoelectronic component having at least a first encapsulation and a second encapsulation, and to an optoelectronic component comprising such an encapsulation system.

BACKGROUND

Optoelectronics is composed of the fields of optics and semiconductor electronics. It especially comprises systems and methods that enable the conversion of electronically generated energies to transmission of light or transmission of light to energy. Optoelectronic components, in particular organic photovoltaic elements and organic light-emitting diodes (OLEDs), generate electrical energy or convert electrical energy to transmission of light.

Organic optoelectronic components, in particular organic solar cells, consist of a sequence of thin layers having at least one photoactive layer, which are preferably applied in a vacuum or processed from solution. The electrical connection may be made via metal layers, transparent conductive oxides and/or transparent conductive polymers. Vacuum vapor deposition of the organic layers is especially advantageous in the case of production of multilayer solar cells, especially tandem or triple cells. The prior art discloses organic single or tandem cells. DE102004014046A1 discloses a photoactive component, in particular a solar cell, consisting of organic layers composed of one or more pi, ni and/or pin diodes stacked one on top of another.

Organic optoelectronic components, in particular organic photovoltaic elements or organic photodetectors, show a significantly reduced lifetime as a result of direct contact with air, especially oxygen, and/or moisture, especially water, and must therefore be given sufficient protection by a barrier layer and/or an encapsulation. Organic optoelectronic components, in particular organic photovoltaic elements, therefore require a barrier for protection from moisture and/or oxygen, in particular an encapsulation, in order to prevent contact of moisture and/or oxygen with the layer system, in particular organic photoactive layers of the layer system, of the optoelectronic component.

Organic optoelectronic components may be protected both against ingress of moisture and oxygen and from mechanical damage by application of protective layers or an encapsulation. For this purpose, specific films and layers having different properties are known, but these are costly; moreover, coating is very complex, and only a few films that meet the high demands are available. Furthermore, in the coating operation, corners of the encapsulated optoelectronic component must be protected against detachment of the layer and the associated ingress of moisture and/or oxygen. The corners and also the edges are sealed in a complex manner for this purpose. Flexible solar cells provided with a protective layer are known; these are usually laminates or film composites that protect internal components from outside influences, and enable reliable electrical contacting from the outside. The demands of the materials are high, particularly when a good moisture barrier is required.

EP 2 927 985 A2 discloses multilayer films for optoelectronic components, comprising one or more barrier layers having low moisture and/or oxygen permeability, and one or more sealing layers.

DE 10 2016 106 846 A1 discloses a multilayer encapsulation having a layer sequence comprising at least one barrier layer and at least one planarization layer, where the barrier layer and the planarization layer together have lower water permeability than the barrier layer, and an optoelectronic component having an encapsulation.

WO2008/014492A2 discloses methods and devices for improved protection of solar cells. The device has an individual encapsulation for a solar cell, where the encapsulated solar cell has at least one protective layer on at least one side of the solar cell, where the at least one protective layer is formed from essentially inorganic material.

US2007/0216300A1 discloses an organic optoelectronic component, where the organic optoelectronic component has a substrate with at least one layer system disposed thereon, and a multilayer barrier layer above the at least one layer system.

U.S. Pat. No. 6,765,351 B2 discloses an organic optoelectronic component having a vacuum-applied protective layer for protection of the organic optoelectronic component from moisture and oxygen.

However, a disadvantage from the prior art is that end regions and edges that have resulted from barrier layers and/or encapsulation are insufficiently protected against outside influences, especially moisture and/or oxygen. The end regions and edges can especially break easily or at least become cracked as a result of folds or creases, which reduces the protection of the optoelectronic component and hence the lifetime thereof. Furthermore, simple bonding of barrier layers applied to one another in a planar manner does not give an adequate barrier function.

SUMMARY

In an embodiment, the present invention provides an encapsulation system for an optoelectronic component, comprising a first encapsulation formed from at least one front barrier layer on a front face of the optoelectronic component and at least one rear barrier layer on a reverse face of the optoelectronic component with at least one first connecting material disposed in between, and a second encapsulation formed from at least one front protective layer on the front face of the optoelectronic component and at least one rear protective layer on the reverse face of the optoelectronic component with at least one second connecting material disposed in between, wherein the first encapsulation surrounds the optoelectronic component such that the first encapsulation projects beyond the optoelectronic component by a first edge region, and the second encapsulation surrounds the first encapsulation comprising the optoelectronic component such that the second encapsulation projects beyond the first edge region of the first encapsulation by a second edge region.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
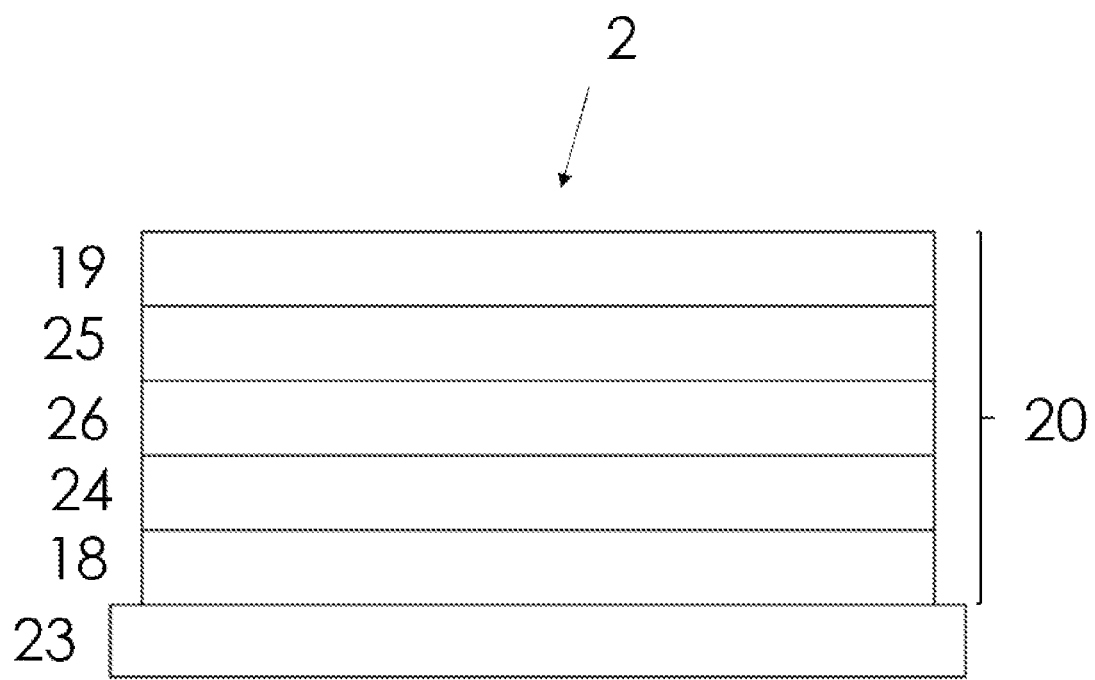
FIG. 1 shows a schematic diagram of an embodiment of a layer system of an optoelectronic component in cross section.

In an embodiment, the invention provides an encapsulation element for an optoelectronic component having at least a first encapsulation and a second encapsulation, and an optoelectronic component having such an encapsulation system, wherein the disadvantages mentioned do not occur, and wherein improved protection of the optoelectronic component from outside influences is especially assured.

In an embodiment, the invention provides an encapsulation system, in particular double encapsulation, for an optoelectronic component, having at least a first encapsulation and a second encapsulation is provided, wherein the first encapsulation is formed from at least one front barrier layer on a front face of the optoelectronic component and at least one rear barrier layer on a reverse face of the optoelectronic component with at least one first connecting material disposed in between, wherein the second encapsulation is formed from at least one front protective layer on the front face of the optoelectronic component and at least one rear protective layer on the reverse face of the optoelectronic component with at least one second connecting material disposed in between. The first encapsulation here surrounds the optoelectronic component in such a way that the first encapsulation projects beyond the optoelectronic component by a first edge region, and the second encapsulation here surrounds the first encapsulation comprising the optoelectronic component in such a way that the second encapsulation projects beyond the first edge region of the first encapsulation by a second edge region. The second encapsulation here is disposed atop the first encapsulation; in particular, the at least one front protective layer is disposed atop the at least one front barrier layer, and the at least one rear protective layer is disposed atop the at least one rear barrier layer.

It is preferably the case in accordance with the invention that the encapsulation system has different zones, especially encapsulation zones, in which case the encapsulation zones especially fulfill different functions, preferably with implementation of a division of a multitude of material properties between any two front layers and rear layers. Preferably, by means of the first encapsulation having a particular width of the first edge region, diffusion of water to the optoelectronic component is at least largely prevented, and, by means of the second encapsulation having a particular width of the second edge region, in addition, mechanical protection of the first encapsulation and hence also of the optoelectronic component is assured. More particularly, the excess first edge region and the excess second edge region can prevent penetration of moisture and/or oxygen through the second encapsulation and through the first encapsulation to the optoelectronic component. A width of the first edge region of the first encapsulation and a width of the second edge region of the second encapsulation is especially formed such that a diffusion length of the first edge region and/or of the second edge region is sufficient to prevent the ingress of moisture and/or oxygen into the interior of the encapsulation, especially into or to the optoelectronic component.

A connecting material is in particular understood to mean a material, preferably an adhesive, or a layer of a material, in particular an adhesive layer, by means of which an element is fixed to a further element, in particular bonded; in particular, two layers are bonded to one another such that they are cohesively joined to one another.

A front face of an optoelectronic component, in particular of a photovoltaic element, and correspondingly also a front barrier layer and a front protective layer, is understood to mean a face of the optoelectronic component that faces sunlight as intended. Accordingly, a reverse face of an optoelectronic component, in particular of a photovoltaic element, and correspondingly also a rear barrier layer and a rear protective layer, is understood to mean a face of the optoelectronic component that faces away from sunlight as intended.

An edge region of an encapsulation is in particular understood to mean the region which projects in its extent beyond the region of a further element disposed beneath or within, especially an optoelectronic component of a further encapsulation, i.e. is greater in its extent than the further element.

In an embodiment of the invention, the first encapsulation, preferably the front face and/or the reverse face of the first encapsulation, is formed from at least two barrier layers, preferably two barrier layers, or preferably three barrier layers, and/or the second encapsulation, preferably the front face and/or the reverse face of the second encapsulation, is formed from at least two protective layers, preferably two protective layers, or preferably three protective layers. In an embodiment of the invention, at least one connecting material is applied in each case between the successive barrier layers and/or the successive protective layers, where the type of the at least one connecting material may be different in each case.

A barrier layer is in particular understood to mean a layer that forms protection, in particular a barrier, against chemical compounds, contaminants, moisture and/or oxygen, especially atmospheric oxygen. The barrier layer is especially a layer for prevention of the permeability of outside influences, especially atmospheric oxygen and/or moisture. In an embodiment, a barrier layer is also a protective layer.

A protective layer is in particular understood to mean a layer for increasing mechanical durability, especially scratch resistance, and/or a filter layer, preferably a layer having a UV filter. In an embodiment, a protective layer is also a barrier layer.

An edge of an optoelectronic component or an encapsulation is in particular understood to mean an edge region of an optoelectronic component or of an encapsulation, in particular an end of the optoelectronic component or of the encapsulation which is disposed in the geometric plane of its greatest horizontal extent.

In an embodiment of the invention, the optoelectronic component is an LED, an OLED, a photovoltaic element, in particular a solar cell, an organic photovoltaic element, in particular an organic solar cell, or a photodetector, in particular an organic photodetector.

In an embodiment of the invention, the first encapsulation, in particular the front face of the first encapsulation, and/or the second encapsulation, in particular the front face of the second encapsulation, is at least largely permeable to light in the visible wavelength region, especially at least largely transparent. In an embodiment of the invention, the at least one front barrier layer, the at least one front protective layer and the first and second connecting materials are at least largely transparent to light in the visible wavelength region.

In an embodiment of the invention, the first encapsulation and/or the second encapsulation is in at least partly transparent form on a side that faces sunlight as intended. In an embodiment of the invention, the at least one front barrier layer of the first encapsulation and the at least one front protective layer of the second encapsulation are in at least partly transparent form.

The encapsulation system of the invention for an optoelectronic component having at least a first encapsulation and a second encapsulation has advantages compared to the prior art. Advantageously, the encapsulation system gives particularly good protection to an optoelectronic component from outside influences, especially environmental influences and mechanical damage. Advantageously, edges and/or corners of the first encapsulation are covered with and protected by the second encapsulation. Advantageously, the edges of the encapsulation are protected from delamination. Advantageously, the lifetime of an optoelectronic component is increased. Advantageously, different properties are divided between at least one first encapsulation and a second encapsulation, especially by barrier layers and/or protective layers having different properties. Advantageously, dependence on suppliers of particular barrier layers and/or protective layers is lower. Advantageously, it enables division of demands between different encapsulations and/or layers of the encapsulations. Advantageously, electrical contact connection takes place by means of a contact element that runs at least largely outside the first encapsulation and beneath the second encapsulation, such that the complexity of the barrier-relevant first encapsulation is reduced. Advantageously, the encapsulation system is producible in a simple, flexible and inexpensive manner, especially in a roll-to-roll method. A roll-to-roll method is especially understood to mean the production of flexible electronic components that are applied to a sheet of flexible polymer film or metal foil. A substrate present on a roll, especially composed of a polymer film, for example PET or PEN, is unrolled, processed and finally rolled up again. For formation of electronic components, materials are applied to this substrate, especially by vapor deposition, printing, coating, sputtering or plasma deposition. A roll-to-roll method is on particular understood to mean a continuous process regime whereby individual components are processed successively.

In connection with the present invention, an element, in particular a layer, that has been applied, disposed or formed atop another element, in particular another layer, is understood to mean direct contact of one element with the other element, or indirect contact, in particular by means of a further layer disposed in between.

In an embodiment of the invention, the first encapsulation is formed over the full extent of the optoelectronic component, the second encapsulation is formed over the full extent of the first encapsulation, and/or the first edge region of the first encapsulation is formed around the optoelectronic component and/or the second edge region of the second encapsulation is formed around the first encapsulation, wherein, preferably, a width of the first edge region is formed differently depending on an edge of the optoelectronic component and/or a width of the second edge region is formed differently depending on an edge of the first encapsulation.

In an embodiment of the invention, corners of the first encapsulation and/or of the second encapsulation are rounded.

In an embodiment of the invention, the at least one front barrier layer and the at least one rear barrier layer of the first encapsulation is formed from different material and/or a different number of layers, and/or the at least one front protective layer and the at least one rear protective layer of the second encapsulation is formed from different material and/or a different number of layers.

In an embodiment of the invention, the first encapsulation is formed from at least two front and/or rear barrier layers, in particular barrier layers having different properties, and/or the second encapsulation is formed from at least two front and/or rear protective layers, in particular protective layers having different properties, wherein the first encapsulation preferably forms protection against moisture and/or oxygen, especially atmospheric oxygen, and the second encapsulation forms mechanical protection.

In an embodiment of the invention, a bonding layer is disposed between the optoelectronic component and the first encapsulation and/or a bonding layer is disposed between the first encapsulation and the second encapsulation, and/or a planarization layer is disposed between the optoelectronic component and the first encapsulation.

In an embodiment of the invention, the bonding layer is disposed between the optoelectronic component and the first encapsulation and/or the bonding layer is disposed between the first encapsulation and the second encapsulation, composed of a material selected from the group consisting of siloxanes/polysiloxanes, epoxides, especially an epoxy resin, acrylates/polyacrylates, especially polymethylmethacrylate (PMMA), styrene/polystyrenes, urethanes/polyurethanes or derivatives thereof in the form of monomers, oligomers or polymers.

In an embodiment of the invention, a layer thickness of the first encapsulation is 20 µm to 400 µm, preferably 50 µm to 200 µm, and/or a layer thickness of the second encapsulation is 50 µm to 1000 µm, preferably 50 µm to 500 µm, or preferably 100 µm to 500 µm, and/or a layer thickness of the first connecting material and/or the second connecting material is 10 µm to 300 µm, preferably 20 µm to 150 µm, or preferably 20 µm to 100 µm. If an encapsulation has multiple layers, the individual layers with respect to one another may have an equal layer thickness or a different layer thickness.

In an embodiment of the invention, the layer thickness of the first encapsulation is 1 µm to 2000 µm, preferably 1 µm to 1000 µm, preferably 1 µm to 100 µm, preferably 1 µm to 10 µm, preferably 5 µm to 1000 µm, preferably 10 µm to 1000 µm, preferably 10 µm to 500 µm, preferably 10 µm to 200 µm, preferably 10 µm to 100 µm, preferably 20 µm to 200 µm, preferably 20 µm to 100 µm, preferably 20 µm to 100 µm, preferably 50 µm to 500 µm, preferably 50 µm to 200 µm, or preferably 50 µm to 100 µm.

In an embodiment of the invention, the layer thickness of the second encapsulation is 10 μm to 2000 μm, preferably 10 μm to 1000 μm, preferably 10 μm to 500 μm, preferably 10 μm to 100 μm, preferably 10 μm to 200 μm, preferably 10 μm to 100 μm, preferably 20 μm to 200 μm, preferably 20 μm to 100 μm, preferably 50 μm to 500 μm, preferably 50 μm to 200 μm, or preferably 50 μm to 100 μm. In a preferred embodiment of the invention, the layer thickness of the second encapsulation is at least 100 μm, preferably at least 1000 μm, or preferably at least 2000 μm.

In an embodiment of the invention, the encapsulation system has flexible properties, where an elasticity (modulus of elasticity) of the encapsulation system is 80 000 psi to 360 000 psi, preferably 100 000 psi to 300 000 psi, preferably 120 000 psi to 260 000 psi, or preferably 100 000 psi to 200 000 psi.

In an embodiment of the invention, the width of the first edge region is 5 mm to 200 mm, preferably 5 mm to 100 mm, preferably 10 mm to 100 mm, preferably 10 mm to 80 mm, preferably 10 mm to 50 mm, preferably 10 mm to 30 mm, preferably 20 mm to 100 mm, or preferably 20 mm to 50 mm, and/or the width of the second edge region is 5 mm to 100 mm, preferably 5 mm to 50 mm, preferably 5 mm to 40 mm, preferably 5 mm to 30 mm, preferably 8 mm to 50 mm, preferably 8 mm to 40 mm, preferably 8 mm to 30 mm, preferably 10 mm to 80 mm, preferably 10 mm to 50 mm, preferably 10 mm to 40 mm, preferably 10 mm to 30 mm, or preferably 20 mm to 40 mm.

In an embodiment of the invention, the layer thickness of the first encapsulation decreases in part toward the first edge region, preferably continuously or discontinuously, preferably up to a width of the first edge region of 5 mm to 60 mm, preferably of 20 mm to 30 mm, and/or the layer thickness of the second encapsulation decreases in part toward the second edge region, preferably continuously or discontinuously, preferably up to a width of the second edge region of 5 mm to 50 mm, preferably of 8 mm to 20 mm.

In an embodiment of the invention, the at least one barrier layer and/or the at least one protective layer is a UV protective layer, an antireflection layer, an anti-moisture and/or -oxygen layer, especially atmospheric oxygen, and/or a mechanical protective layer, preferably for increasing scratch resistance.

In an embodiment of the invention, the at least one front barrier layer and/or the at least one rear barrier layer includes a material selected from the group consisting of polyacrylate (PA), polycarbonate (PC), polyethylene (PE), polyethylene naphthalate (PEN), polyethylene terephthalate (PET), polypropylene (PP), polyvinylchloride (PVC), and thermoplastic polyurethane (TPU), where, preferably, the material of the front and/or rear barrier layer has been coated, and/or the at least one front protective layer and/or the at least one rear protective layer includes a material selected from the group consisting of ethylene-vinyl acetate (EVA), polyacrylate (PA), polycarbonate (PC), polyethylene (PE), polyethylene naphthalate (PEN), polyethylene terephthalate (PET), polymethylmethacrylate (PMMA), polypropylene (PP), polyvinylchloride (PVC), and thermoplastic polyurethane (TPU), where the material of the front and/or rear protective layer has preferably been coated.

In an embodiment of the invention, at least one barrier layer and/or at least one protective layer has a coating, where the coating imparts particular functional properties to the barrier layers and/or the protective layers. In an embodiment of the invention, at least one barrier layer and/or at least one protective layer has been coated with ethylene-tetrafluoroethylene (ETFE), polyvinylidenefluoride (PVDF), polyvinylfluoride (PVF), or polytetrafluoroethylene (PTFE), or with $Al_2O_3$, ITO (indium tin oxide), $SiO_x$, $TiO_2$ or $ZrO_2$.

In an embodiment of the invention, the first encapsulation and/or the second encapsulation is at least largely electrically insulating.

In an embodiment of the invention, the first connecting material and/or the second connecting material is selected from the group consisting of acrylates, epoxides and polyurethanes, preferably in a 1-component or 2-component composition. In an embodiment of the invention, the first connecting material and/or the second connecting material is a curable material, in particular a crosslinkable material, preferably by UV curing or thermal curing.

A connecting material of an encapsulation is in particular understood to mean a material for bonding, in particular for adhesive bonding, of layers, in particular barrier layers and/or protective layers, to one another and/or the optoelectronic component.

In an embodiment of the invention, the first connecting material and/or the second connecting material is selected from the group consisting of siloxanes/polysiloxanes, epoxides, especially an epoxy resin, acrylate/polyacrylates, especially polymethylmethacrylate (PMMA), styrenes/polystyrenes, urethanes/polyurethanes or derivatives thereof in the form of monomers, oligomers or polymers.

In an embodiment of the invention, the first connecting material and/or the second connecting material includes an initiator and/or a catalyst for acceleration of curing and/or of crosslinking.

In an embodiment of the invention, the layer thickness of the first encapsulation in the first edge region is 1 μm to 100 μm, preferably 10 μm to 50 μm, or preferably 10 μm to 30 μm, and/or the layer thickness of the second encapsulation in the second edge region is 1 μm to 100 μm, preferably 10 μm to 50 μm, or preferably 10 μm to 30 μm.

In an embodiment of the invention, the first edge region and/or the second edge region, in particular the edges of the first edge region and/or the edges of the second edge region, are sealed.

In an embodiment of the invention, at least two optoelectronic components are encapsulated collectively in the encapsulation system, preferably with at least two optoelectronic components each encapsulated individually by the first encapsulation and encapsulated collectively by the second encapsulation.

In an embodiment of the invention, a functional layer may be disposed at least in part between the first encapsulation and the second encapsulation and/or between the optoelectronic component and the first encapsulation, preferably a color layer, a filter layer and/or an adhesive layer.

In an embodiment of the invention, the encapsulation system has at least one further encapsulation, preferably a third encapsulation, where the third encapsulation surrounds the second encapsulation, or preferably a third encapsulation and a fourth encapsulation, where the third encapsulation surrounds the second encapsulation and where the fourth encapsulation surrounds the third encapsulation. In a preferred embodiment of the invention, the third encapsulation is composed of at least one front protective layer on the front face of the optoelectronic component and at least one rear protective layer on the reverse face of the optoelectronic component with at least one connecting material disposed in between, where the third encapsulation preferably surrounds the second encapsulation in such a way that the third encapsulation projects beyond the second edge region of the second encapsulation by an edge region.

In some embodiments, advantages of the present invention are also achieved in that an optoelectronic component, preferably a flexible optoelectronic component, with an encapsulation system of the invention, in particular a double encapsulation, is provided, in particular according to one of the working examples described above. Advantages that arise in respect of the optoelectronic component are especially those that have already been described in connection with the encapsulation system. The optoelectronic component has a layer system with an electrode, a counterelectrode, and at least one photoactive layer, where the at least one photoactive layer is disposed between the two electrodes.

In an embodiment of the invention, the photovoltaic element comprises a cell having at least one photoactive layer, in particular a CIS cell, CIGS cell, GaAs cell, or Si cell, a perovskite cell or an organic photovoltaic element (OPV), called an organic solar cell.

An organic photovoltaic element is in particular understood to mean a photovoltaic element having at least one organic photoactive layer, in particular a polymeric organic photovoltaic element or an organic photovoltaic element based on small molecules. While it is a feature of polymers that these are not evaporable and therefore can be applied only from solutions, small molecules are usually evaporable and can be applied either as a solution like polymers or else by means of evaporation methodology, especially by evaporation from the vacuum. The organic photoactive layer is especially a photoactive layer in which excitons (electron-hole pairs) are formed by radiation of visible light, UV radiation and/or IR radiation. The organic materials are applied here to the foils in the form of thin films or small volumes by printing, bonding, coating, vapor deposition or in some other way.

In an embodiment of the invention, the at least one photoactive layer is formed from organic materials, preferably from small organic molecules or polymeric organic molecules, in particular preferably from small organic molecules.

Small molecules are in particular understood to mean nonpolymeric organic molecules having monodisperse molar masses between 100 and 2000 g/mol that are in the solid phase at standard pressure (air pressure of our surrounding atmosphere) and at room temperature. More particularly, the small molecules are photoactive, "photoactive" being understood to mean that the molecules change their state of charge and/or state of polarization with input of light.

In an embodiment of the invention, the optoelectronic component has a substrate, preferably a foil, where the layer system of the optoelectronic component is disposed on the substrate.

In an embodiment of the invention, the optoelectronic component has at least one busbar, preferably at least two busbars, where the at least one busbar is disposed beneath the first encapsulation and/or the second encapsulation and is at least partly in electrically conductive contact with the electrode and/or the counterelectrode of the optoelectronic component, and where the at least one busbar is in electrically conductive contact with a connection box outside the second encapsulation by means of at least one contact element.

A busbar is in particular understood to mean an arrangement which, for electrical contact connection, as central distributor of electrical energy, is connected in an electrically conductive manner to incoming and outgoing wires, preferably by at least one electrode and/or at least one counterelectrode. The busbar is in particular in planar form as a ribbon, strip, plate or metal layer.

A connection box is in particular understood to mean an element for connection of the optoelectronic component to an external circuit. The connection box especially serves for electrically conductive connection of at least one busbar disposed beneath the at least one protective layer of the optoelectronic component to an electrical circuit.

In an embodiment of the invention, the contact element, in particular an electrically conductive contact element, is disposed at least largely between the first encapsulation and the second encapsulation, where the layer system of the optoelectronic component is contacted in an electrically conductive manner through the first encapsulation.

In an embodiment of the invention, the optoelectronic component is a photovoltaic element, in particular a solar cell.

In an embodiment of the invention, multiple cells of the photovoltaic element are disposed alongside one another and connected in series. Each cell preferably has its own electrode and counterelectrode. The series connection is effected by electrical connection of the electrodes of a cell to the counterelectrode of the next cell.

An optoelectronic component is in particular understood to be a photovoltaic element. A photovoltaic element is in particular understood to mean a photovoltaic cell, in particular a solar cell. The photovoltaic element is preferably formed from multiple photovoltaic cells that may be connected in series or in parallel. The multiple photovoltaic cells may be disposed and/or connected in different ways in the optoelectronic component.

In an embodiment of the invention, the at least one busbar has been applied directly to the electrode or counterelectrode, i.e. connected in an electrically conductive manner. In an embodiment, an electrically conductive layer is disposed between the at least one busbar and the electrode or counterelectrode.

In an embodiment of the invention, the optoelectronic component is a flexible optoelectronic component. In an embodiment of the invention, the flexible optoelectronic component is a flexible photovoltaic element, in particular a flexible organic photovoltaic element.

A flexible optoelectronic component is in particular understood to mean an optoelectronic component which is bendable and/or extensible in a particular region.

The working examples especially relate to an optoelectronic component produced in a roll-to-roll method.

FIG. 1 shows a schematic diagram of a working example of a layer system 20 of an optoelectronic component 2 in cross section.

The optoelectronic component 2, in particular an organic photovoltaic element, consists of a sequence of thin layers, comprising the layer system 20, comprising at least one photoactive layer 26 which is preferably applied by vapor deposition in a vacuum or from a solution. The electrical connection can be effected via metal layers, transparent conductive oxides and/or transparent conductive polymers. Vacuum vapor deposition of the organic layers is especially advantageous in the case of production of multiple photovoltaic elements, in particular tandem or triple cells.

A layer system 20 of such an optoelectronic component 2 is shown in a working example in FIG. 1. The optoelectronic component 2 has a layer system 20 with at least two electrodes 18, e.g. ITO, and 19, e.g. aluminum, and at least one photoactive layer 26 with at least one absorber material on a substrate 23, for example a polymer film, wherein the at least one photoactive layer 26 is disposed between the two electrodes 18, 19. The layer system 20 may additionally have a hole transport layer 24 and a charge carrier layer 25. The layer system 20 with the electrodes 18, 19 may be laser-structured.

Figure 2:
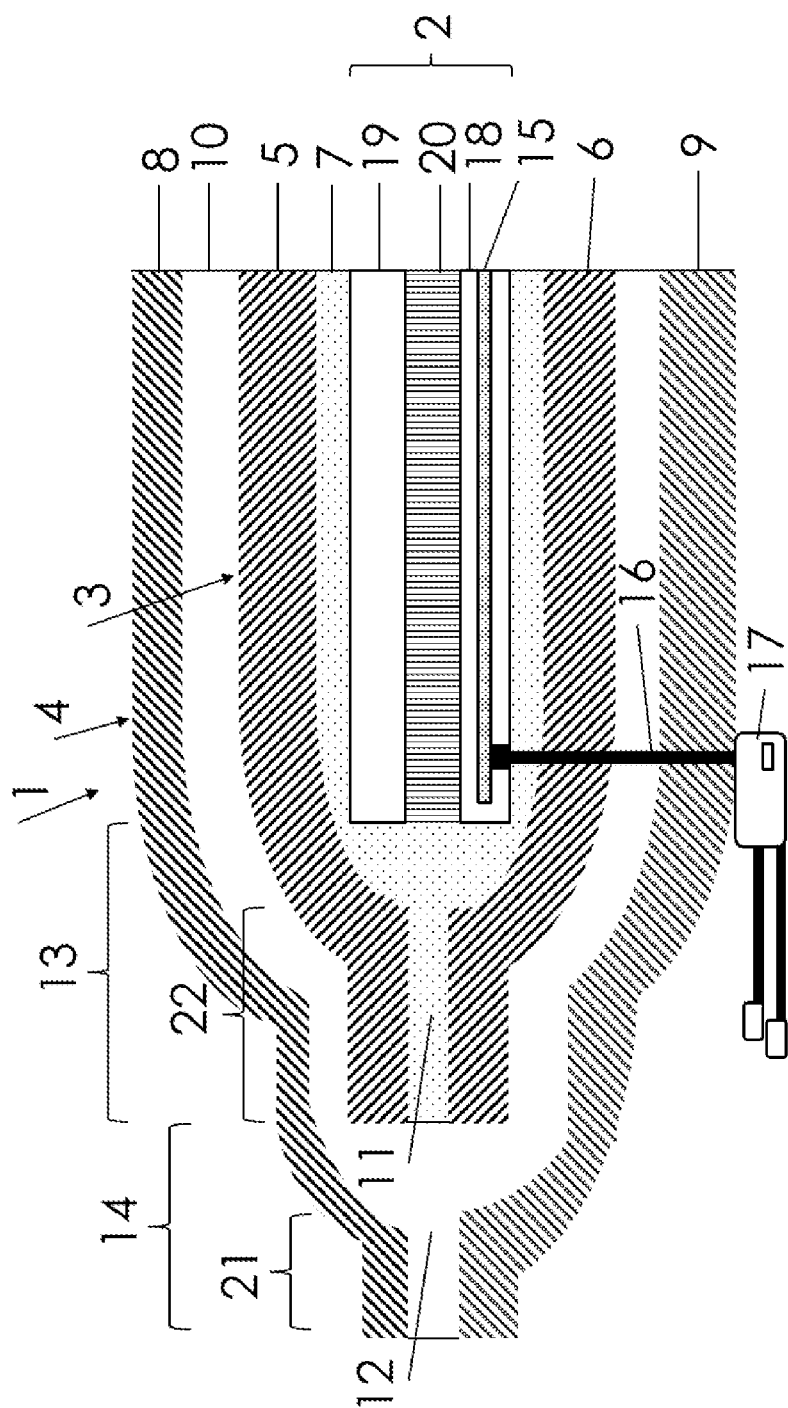
FIG. 2 shows a schematic diagram of an embodiment of an optoelectronic component with an encapsulation system in a cross section.

FIG. 2 shows a schematic diagram of a working example of an optoelectronic component 2 with an encapsulation system 1 in a cross section. Elements that are the same and have the same function are given the same reference numerals, and so reference is made to the preceding description in that respect. In this working example, the optoelectronic component 2 is an organic photovoltaic element.

The encapsulation system 1, in particular a double encapsulation, for an optoelectronic component 2 has at least a first encapsulation 3 and a second encapsulation 4, where the first encapsulation 3 is formed from at least one front barrier layer 5 on a front face of the optoelectronic component 2 and at least one rear barrier layer 6 on a reverse face of the optoelectronic component 2 with at least a first connecting material 7 disposed in between, where the second encapsulation 4 is formed from at least one front protective layer 8 on the front face of the optoelectronic component 2 and at least one rear protective layer 9 on the reverse face of the optoelectronic component 2 with at least a second connecting material 10 disposed in between. The first encapsulation 3 surrounds the optoelectronic component 2 in such a way that the first encapsulation 3 projects beyond the optoelectronic component 2 by a first edge region 11. The second encapsulation 4 surrounds the first encapsulation 3 comprising the optoelectronic component 2 in such a way that the second encapsulation 4 projects beyond the first edge region 11 of the first encapsulation 3 by a second edge region 12. The optoelectronic component 2 is encapsulated by the encapsulation system 1 and fully enclosed on all sides. The edge regions 11, 12 here may be different.

As a result, the encapsulation system gives particularly good protection of the optoelectronic component 2 from outside influences, especially environmental influences and mechanical damage. As a result, in particular, edges and/or corners of the first encapsulation 3 are covered by the second encapsulation 4 and protected against delamination. Advantageously, different properties of barrier layers 5, 6 and/or protective layers 8, 9 are divided between at least the first encapsulation 3 and the second encapsulation 4.

The barrier layers 5, 6 and/or the protective layers 8, 9 for formation of the first encapsulation 3 and/or of the second encapsulation 4 may be applied by the deposition methods known to the person skilled in the art, for example by means of an atomic layer deposition method (ALD), a plasma-assisted atomic layer deposition method (PEALD) or a plasmaless atomic layer deposition method (PLALD), by means of a chemical vapor phase deposition method (CVD), a plasma-assisted vapor phase deposition method (PECVD), a plasmaless vapor phase deposition method (PLCVD), and/or alternatively by means of other suitable deposition methods.

In an embodiment of the invention, the first encapsulation 3 is formed over the full extent of the optoelectronic component 2, and the second encapsulation 4 over the full extent of the first encapsulation 3, and/or the first edge region 11 of the first encapsulation 3 is formed around the optoelectronic component 2 and/or the second edge region 12 of the second encapsulation 4 is formed around the first encapsulation 3, where a width 13 of the first edge region 11 is formed differently depending on an edge of the optoelectronic component 2 and/or a width 14 of the second edge region 12 is formed differently depending on an edge of the first encapsulation 3.

In an embodiment of the invention, the at least one front barrier layer 5 and the at least one rear barrier layer 6 of the first encapsulation 3 is formed from different material and/or a different number of layers, and/or the at least one front barrier layer 8 and the at least one rear barrier layer 9 of the second encapsulation 4 is formed from different material and/or a different number of layers.

In an embodiment of the invention, the first encapsulation 3 is formed from at least two front and/or rear barrier layers 5, 6, in particular barrier layers 5, 6 having different properties, and/or the second encapsulation 4 is formed from at least two front and/or rear protective layers 8, 9, in particular protective layers 8, 9 having different properties, where the first encapsulation 3 preferably forms protection against moisture and/or oxygen, especially atmospheric oxygen, and the second encapsulation 4 forms mechanical protection.

In an embodiment of the invention, an adhesive layer is disposed between the optoelectronic component 2 and the first encapsulation 3 and/or an adhesive layer is disposed between the first encapsulation 3 and the second encapsulation 4, and/or a planarization layer is disposed between the optoelectronic component 2 and the first encapsulation 3.

In an embodiment of the invention, a layer thickness of the first encapsulation 3 is 20 μm to 400 μm, preferably 50 μm to 200 μm, and/or a layer thickness of the second encapsulation 4 is 50 μm to 1000 μm, preferably 100 μm to 500 μm, and/or a layer thickness of the first connecting material 7 and/or of the second connecting material 10 is 10 μm to 300 μm, preferably 20 μm to 100 μm.

In an embodiment of the invention, the width 13 of the first edge region 11 is 5 mm to 200 mm, preferably 20 mm to 50 mm, and/or the width 14 of the second edge region 12 is 5 mm to 100 mm, preferably 8 mm to 40 mm.

In an embodiment of the invention, the layer thickness of the first encapsulation 3 decreases in part toward the first edge region 11, preferably up to a width 21 of the first edge region 11 of 5 mm to 60 mm, preferably of 20 mm to 30 mm, and/or the layer thickness of the second encapsulation 4 decreases in part toward the second edge region 12, preferably up to a width 22 of the second edge region 12 of 5 mm to 50 mm, preferably of 8 mm to 20 mm.

In an embodiment of the invention, the at least one barrier layer 5, 6 and/or the at least one protective layer 8, 9 is a UV protective layer, an antireflection layer, an anti-moisture and/or
oxygen layer, and/or a mechanical protective layer, preferably for increasing scratch resistance.

In an embodiment of the invention, the at least one front barrier layer 5 and/or the at least one rear barrier layer 6 includes a material selected from the group consisting of polyacrylate (PA), polycarbonate (PC), polyethylene (PE), polyethylene naphthalate (PEN), polyethylene terephthalate (PET), polypropylene (PP), polyvinylchloride (PVC), and thermoplastic polyurethane (TPU), where, preferably, the material of the front and/or rear barrier layer 5, 6 has been coated, and/or the at least one front protective layer 8 and/or the at least one rear protective layer 9 includes a material selected from the group consisting of ethylene-vinyl acetate (EVA), polyacrylate (PA), polycarbonate (PC), polyethylene (PE), polyethylene naphthalate (PEN), polyethylene terephthalate (PET), polymethylmethacrylate (PMMA), polypropylene (PP), polyvinylchloride (PVC), and thermoplastic polyurethane (TPU), where the material of the front and/or rear protective layer 8, 9 has preferably been coated.

In an embodiment of the invention, the first connecting material 7 and/or the second connecting material 10 is selected from the group consisting of acrylates, epoxides and polyurethanes, preferably in a 1-component or 2-component composition In an embodiment of the invention, the first edge region 11 and/or the second edge region 12, in particular the edges of the first edge region 11 and/or the edges of the second edge region 12, are sealed, and/or at least two optoelectronic components 2 are encapsulated collectively in the encapsulation system 1, preferably with at least two optoelectronic components 2 each encapsulated individually by the first encapsulation 3 and encapsulated collectively by the second encapsulation 4.

The optoelectronic component 2 is encapsulated by the encapsulation system 1, in particular a double encapsulation. The optoelectronic component 2 has a layer system 20 comprising an electrode 18, a counterelectrode 19, and at least one photoactive layer 26, where the at least one photoactive layer 26 is disposed between the two electrodes 18, 19.

In an embodiment of the invention, the optoelectronic component 2 has at least one busbar 15, preferably at least two busbars 15, which is disposed beneath the first encapsulation 3 and/or the second encapsulation 4 and is at least partly in electrically conductive contact with the electrode 18 and/or the counterelectrode 19 of the optoelectronic component 2, and where the at least one busbar 15 is in electrically conductive contact with a connection box 17 outside the second encapsulation 4 by means of at least one contact element 16.

In an embodiment of the invention, the optoelectronic component 2 is a photovoltaic element, in particular a solar cell, preferably a flexible organic photovoltaic element.

In one working example, the encapsulation system 1 may be produced as follows: in this working example, the encapsulation system 1 is formed by first unrolling a material for application of a barrier layer 5, 6, consisting of a 100 µm-thick PET carrier material and multiple SiOx layers, from a roll and coating the inside over the full area by a slot die method with a 50 µm-thick acrylate adhesive layer as connecting material 7. The operation is repeated on a second roll made of the same material. Both the coated rolls are thus supplied to a lamination system in such a way that the two sides coated with the acrylate adhesive layer are oriented toward to one another and the edges of the rolls are superposed. An optoelectronic component 2 is separated from a third roll, fed to the lamination system between the barrier layers 5, 6 and compressed. The optoelectronic component 2 is, for example, 2 m long and 30 cm wide. Compression in the lamination system is followed by curing of the connecting material 7 by means of heating under infrared lamps. This can be effected, for example, at 100° C. for a duration of 180 s. The optoelectronic component 2 is thus encapsulated with a first encapsulation 3 having a first edge region 11. The second encapsulation 4 largely follows the sequences of the first encapsulation 3. This time, however, materials for formation of protective layers 8, 9 are applied. In this working example, mechanical protective films are used, but direct coating is alternatively also conceivable. In this working example, the front protective layer 8 is a 100 µm-thick PET base film having, on the side remote from the optoelectronic component 2, a protective lacquer which is weathering-stable and has UV-blocking action. The rear protective layer 9 is a PP coextrudate having a layer thickness of 200 µm. The connecting material 7, 10 in both encapsulations is a 2-component polyurethane adhesive; the curing is effected in a heat-assisted manner at 100° C. over a duration of 180 s, but it is also possible to use a different first connecting material 7 and second connecting material 10.

The first encapsulation 3 and/or the second encapsulation 4 may alternatively be cured by means of UV curing, dual curing, thermal curing and/or by means of a reaction gas. The barrier layers 5, 6 and/or the protective layers 8, 9 may alternatively be applied by means of a printing method, preferably a screenprinting method, a plotting method, an inkjet printing method or a 3D printing method, a slot die method, a comma bar method, or a knife-coating method.

The first encapsulation 3 and the second encapsulation 4 of the optoelectronic component 2 are especially performable in a roll-to-roll method.

Figure 3:
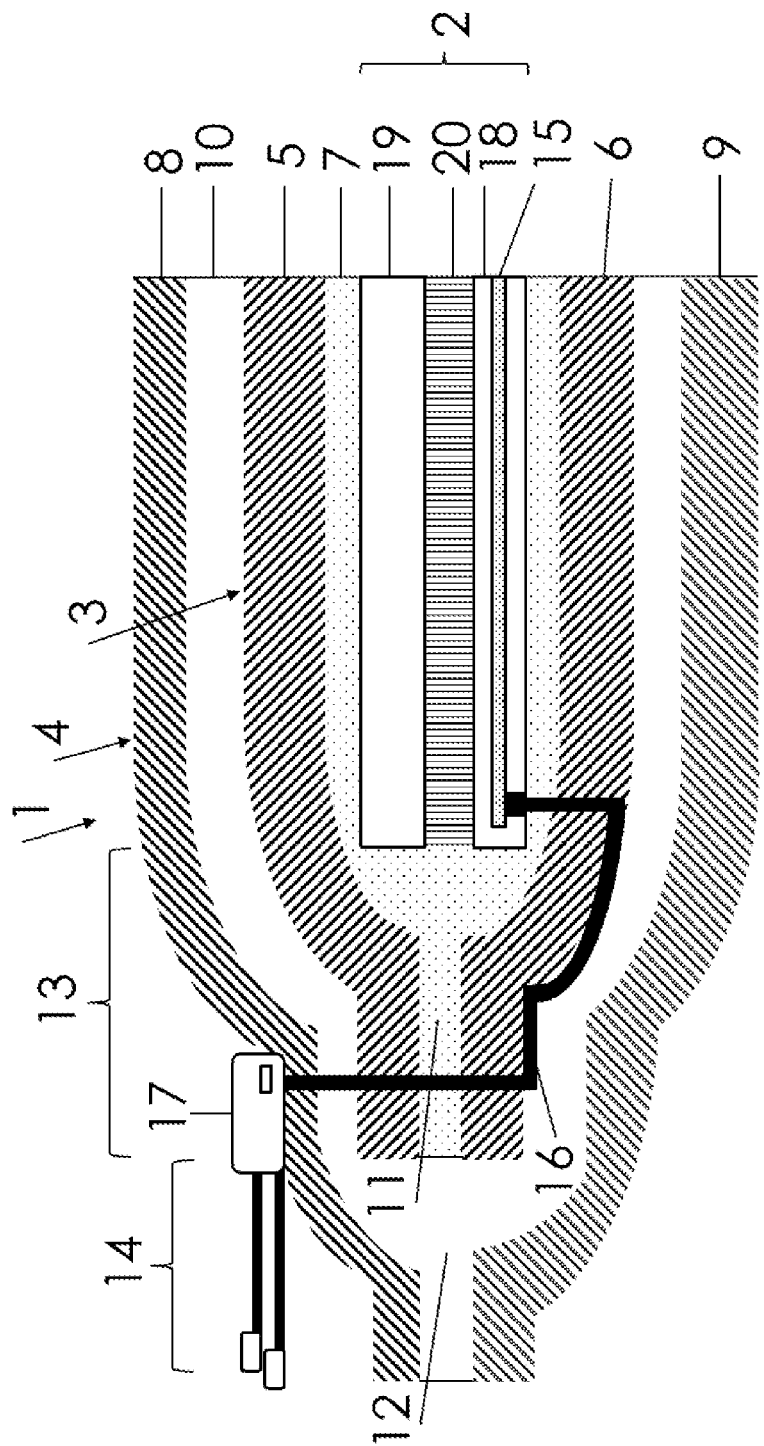
FIG. 3 shows a schematic diagram of an embodiment of an optoelectronic component with an encapsulation system in a cross section.

FIG. 3 shows a schematic diagram of a working example of an optoelectronic component 2 with an encapsulation system 1 in a cross section. Elements that are the same and have the same function are given the same reference numerals, and so reference is made to the preceding description in this respect. In this working example, the optoelectronic component 2 is an organic photovoltaic element.

The electrical contact connection 16, where the at least one busbar 15 is at least partly connected in an electrically conductive manner to the electrode 18 or the counterelectrode 19 may be performed as follows: in a step a), the optoelectronic component 2 having the first encapsulation 3 is provided, where the optoelectronic component 2 has at least one busbar 15 disposed beneath the first encapsulation. In a step b), at least one opening is formed by means of laser ablation with at least one laser beam in the first encapsulation 3, partly exposing at least one busbar 15 disposed beneath the first encapsulation 3. In a step c), a low-melting solder is introduced into the at least one opening, and an electrically conductive element is aligned on a side of the at least one opening opposite the at least one busbar 15. In a step d), by means of inductive soldering, an electrically conductive contact element 16 is formed in the at least one opening. After the application of the second encapsulation, for electrically conductive connection of the connection box 17, in a step e), at least one connection opening is formed by means of laser ablation with at least one laser beam in the second encapsulation 4. In a step f), the connection box 17 is contacted in an electrically conductive manner with the electrically conductive contact element 16. The parameters of the laser ablation, especially an energy density, a pulse duration, a pulse shape, a pulse frequency and/or a wavelength of the at least one laser beam, are adjusted depending on the material and the layer thickness of the first encapsulation 3 and/or of the second encapsulation 4, and the parameters of the inductive soldering are adjusted depending on the material and dimensions of the connecting element to be formed.

Figure 4:
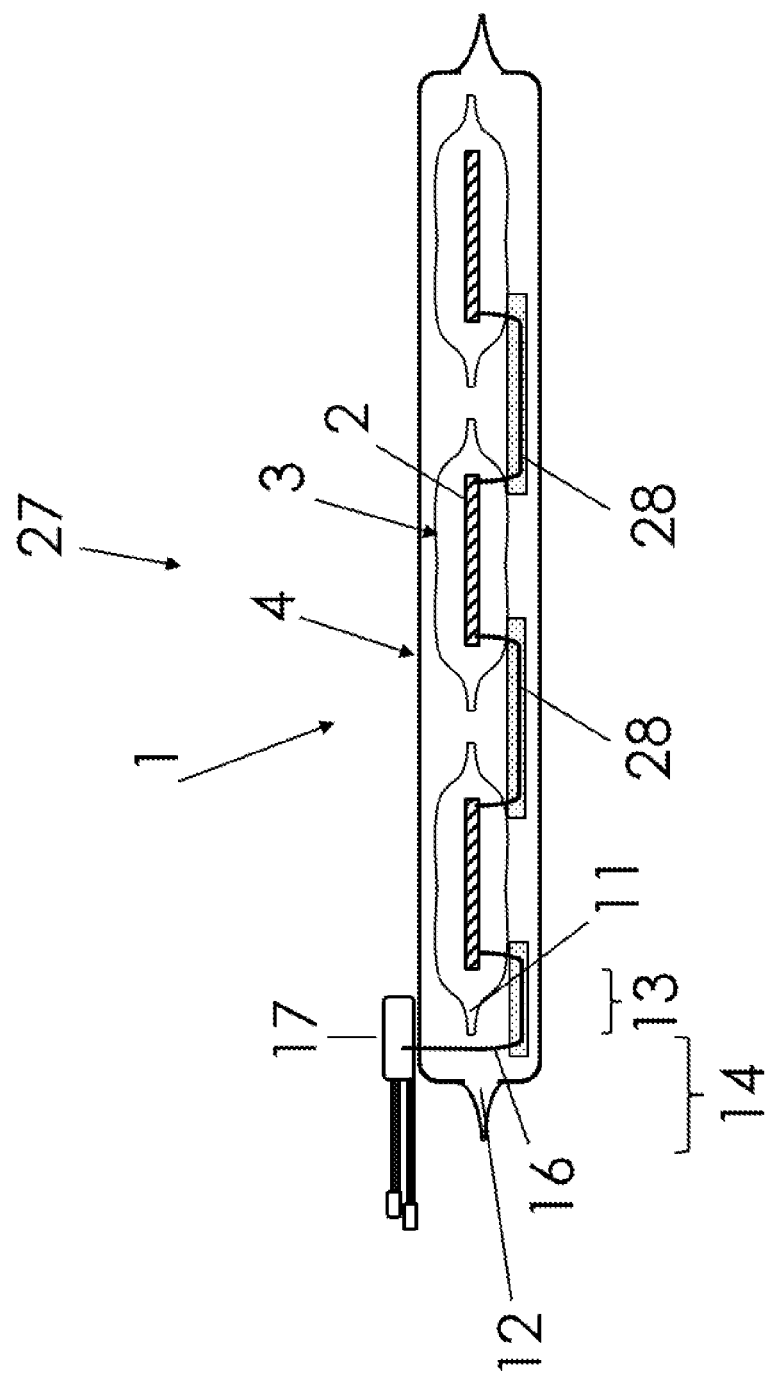
FIG. 4 shows a schematic diagram of an embodiment of multiple optoelectronic components encapsulated in an encapsulation system in cross section.

FIG. 4 shows a schematic diagram of a working example of multiple optoelectronic components 2 encapsulated in an encapsulation system 1 in cross section. Elements that are the same and have the same function are given the same reference numerals, and so reference is made to the preceding description in this respect.

In an embodiment of the invention, at least two optoelectronic components 2 are encapsulated collectively in the encapsulation system 1, preferably with at least two optoelectronic components 2 each encapsulated individually by the first encapsulation 3 and encapsulated collectively by the second encapsulation 4.

In the present working example, three optoelectronic components 2 are each encapsulated individually by a first encapsulation 3, and then the optoelectronic components 2 encapsulated individually by the first encapsulation 3 are encapsulated collectively by a second encapsulation 4, giving an individually encapsulated component 27. The individual optoelectronic components 2, especially the individual photovoltaic elements, are connected to one another here in an electrically conductive manner via line elements 28. The optoelectronic components 2 here may be connected in parallel or connected in series.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An encapsulation system for an optoelectronic component, comprising:
    a first encapsulation formed from at least one front barrier layer on a front face of the optoelectronic component and at least one rear barrier layer on a reverse face of the optoelectronic component with at least one first connecting material forming a first connecting material body disposed in between the at least one front barrier layer and the at least one rear barrier layer along an entire extent of the at least one front barrier layer and the at least one rear barrier layer; and
    a second encapsulation formed from at least one front protective layer on the front face of the optoelectronic component and at least one rear protective layer on the reverse face of the optoelectronic component with at least one second connecting material forming a second connecting material body disposed in between, wherein:
    the first encapsulation surrounds the optoelectronic component such that the first encapsulation projects beyond the optoelectronic component by a first edge region, the at least one front barrier layer is bonded to the at least one rear barrier layer in the first edge region such that the at least one front barrier layer and the at least one rear barrier layer are cohesively joined to one another,
    the first connecting material and the second connecting material are each an adhesive or form an adhesive layer,
    the second encapsulation surrounds the first encapsulation comprising the optoelectronic component such that the second encapsulation projects beyond the first edge region of the first encapsulation by a second edge region,
    the first encapsulation is formed over an entire extent of the optoelectronic component,
    the second encapsulation is formed over an entire extent of the first encapsulation,
    the first edge region of the first encapsulation is formed around the optoelectronic component, and the second edge region of the second encapsulation is formed around the first encapsulation,
    the at least one front protective layer is bonded to the at least one rear protective layer in the second edge region such that the at least one front protective layer and the at least one rear protective layer are cohesively joined to one another,
    the width of the first edge region is 5 mm to 200 mm, and/or the width of the second edge region is 5 mm to 100 mm, and
    the optoelectronic component is a flexible optoelectronic component, and wherein a layer thickness of the first encapsulation decreases in part toward the first edge region and a layer thickness of the second encapsulation decreases in part toward the second edge region.

2. The encapsulation system as claimed in claim 1, wherein:
    a width of the first edge region is formed differently depending on an edge of the optoelectronic component and/or a width of the second edge region is formed differently depending on an edge of the first encapsulation.

3. The encapsulation system as claimed in claim 1, wherein the at least one front barrier layer and the at least one rear barrier layer of the first encapsulation is formed from different material and/or a different number of layers, and/or the at least one front protective layer and the at least one rear protective layer of the second encapsulation is formed from different material and/or a different number of layers.

4. The encapsulation system as claimed in claim 1, wherein the first encapsulation is formed from at least two front and/or rear barrier layers having different properties, and/or the second encapsulation is formed from at least two front and/or rear protective layers having different properties, and wherein the first encapsulation forms protection against moisture and/or oxygen and the second encapsulation forms mechanical protection.

5. The encapsulation system as claimed in claim 1, wherein a bonding layer is disposed between the optoelectronic component and the first encapsulation, and/or a bonding layer is disposed between the first encapsulation and the second encapsulation, and/or a planarization layer is disposed between the optoelectronic component and the first encapsulation.

6. The encapsulation system as claimed in claim 1, wherein the layer thickness of the first encapsulation is 20 µm to 400 µm, and/or the layer thickness of the second encapsulation is 50 µm to 1000 µm, and/or a layer thickness of the first connecting material body and/or of the second connecting material body (10) is 10 µm to 300 µm.

7. The encapsulation system as claimed in claim 1, wherein the layer thickness of the first encapsulation decreases in part toward the first edge region up to a width of the first edge region of 5 mm to 60 mm, and/or the layer thickness of the second encapsulation decreases in part toward the second edge region up to a width of the second edge region of 5 mm to 50 mm.

8. The encapsulation system as claimed in claim 1, wherein the at least one front barrier layer, the at least one rear barrier layer, the at least one front protective layer, and/or the at least one rear protective layer is a UV protective layer, an antireflection layer, an anti-moisture and/or anti-oxygen layer, and/or a mechanical protective layer for increasing scratch resistance.

9. The encapsulation system as claimed in claim 1, wherein the at least one front barrier layer and/or the at least one rear barrier layer includes a material selected from the group consisting of polyacrylate (PA), polycarbonate (PC), polyethylene (PE), polyethylene naphthalate (PEN), polyethylene terephthalate (PET), polypropylene (PP), polyvinylchloride (PVC), and thermoplastic polyurethane (TPU), and wherein the material of the front and/or rear barrier layer has been coated.

10. The encapsulation system as claimed in claim 1, wherein the first connecting material and/or the second connecting material is selected from the group consisting of acrylates, epoxides and polyurethanes in a 1-component or 2-component composition.

11. The encapsulation system as claimed in claim 1, wherein the edges of the first edge region and/or the edges of the second edge region are sealed, and/or at least two optoelectronic components are encapsulated collectively in the encapsulation system with at least two optoelectronic components each encapsulated individually by the first encapsulation and encapsulated collectively by the second encapsulation.

12. The encapsulation system as claimed in claim 1, wherein the at least one front protective layer and/or the at least one rear protective layer includes a material selected from the group consisting of ethylene-vinyl acetate (EVA), polyacrylate (PA), polycarbonate (PC), polyethylene (PE), polyethylene naphthalate (PEN), polyethylene terephthalate (PET), polymethylmethacrylate (PMMA), polypropylene (PP), polyvinylchloride (PVC), and thermoplastic polyurethane (TPU), where the material of the front and/or rear protective layer has been coated.

13. The encapsulation system as claimed in claim 1, wherein the first edge region and the second edge region each have a diffusion length configured to prevent ingress of moisture and/or oxygen into an interior of the first encapsulation and the second encapsulation, respectively.

14. The encapsulation system as claimed in claim 1, wherein the at least one front barrier layer and the at least one rear barrier layer are bonded directly to one another via the first connecting material body in the first edge region, and wherein the at least one front protective layer and the at least one rear protective layer are bonded directly to one another via the second connecting material body in the second edge region.

15. An optoelectronic component having an encapsulation system as claimed in claim 1, having a layer system having an electrode, a counterelectrode, and at least one photoactive layer, wherein the at least one photoactive layer is disposed between the two electrodes.

16. The optoelectronic component as claimed in claim 15, wherein the optoelectronic component has at least one busbar disposed beneath the first encapsulation and/or the second encapsulation and is at least partly in electrically conductive contact with the electrode and/or the counterelectrode of the optoelectronic component, and where the at least one busbar is in electrically conductive contact with a connection box outside the second encapsulation by at least one contact element.

17. The optoelectronic component as claimed in claim 15, wherein the optoelectronic component is a photovoltaic element.

18. An encapsulation system, comprising:
- an optoelectronic component including a front face and a reverse face;
- a first encapsulation formed from at least one front barrier layer and at least one rear barrier layer, the first encapsulation forming a first edge region;
- a first connecting material forming a first connecting material body arranged between the at least one front barrier layer and the front face, between the at least one rear barrier layer and reverse face, and between the at least one front barrier layer and the at least one rear barrier layer in the first edge region;
- a second encapsulation formed from at least one front protective layer and at least one rear protective layer, the second encapsulation forming a second edge region; and
- a second connecting material forming a second connecting material body arranged between the at least one front protective layer and the at least one front barrier layer, between the at least one rear protective layer and the at least one rear barrier layer, and between the at least one front protective layer and the at least one rear protective layer in the second edge region, the second connecting material body being arranged along an entire extent of the at least one front protective layer and the at least one rear protective layer,
- wherein the first connecting material surrounds the optoelectronic component, wherein the second connecting material surrounds the first encapsulation, wherein the first connecting material body abuts the second connecting material body, and wherein a layer thickness of the first encapsulation decreases in part toward the first edge region and a layer thickness of the second encapsulation decreases in part toward the second edge region.

19. The system of claim 18, wherein the optoelectronic component, the first edge region, and the second edge region each have a respective axial center axis, and wherein each of the respective axial center axes are coincident with one another.

20. The system of claim 18, wherein the first edge region extends away from the optoelectronic component in an axial direction towards the second edge region, and wherein the second edge region extends away from the first edge region in the axial direction.

\* \* \* \* \*